United States Patent
Kuang (10) Patent No.: US 9,724,735 B2
(45) Date of Patent: Aug. 8, 2017

(54) CLEANING METHOD AND CLEANING APPARATUS FOR A MASK

(71) Applicant: Shenzhen China Star Optoelectronics Technology Co., Ltd., Shenzhen, Guangdong (CN)

(72) Inventor: Youyuan Kuang, Guangdong (CN)

(73) Assignee: Shenzhen China Star Optoelectronics Technology Co., Ltd, Shenzhen, Guangdong (CN)

( * ) Notice: Subject to any disclaimer, the term of this patent is extended or adjusted under 35 U.S.C. 154(b) by 351 days.

(21) Appl. No.: 14/378,612

(22) PCT Filed: Jul. 2, 2014

(86) PCT No.: PCT/CN2014/081443
§ 371 (c)(1),
(2) Date: Aug. 13, 2014

(87) PCT Pub. No.: WO2015/188416
PCT Pub. Date: Dec. 17, 2015

(65) Prior Publication Data
US 2016/0228926 A1    Aug. 11, 2016

(30) Foreign Application Priority Data

Jun. 12, 2014  (CN) .......................... 2014 1 0263585

(51) Int. Cl.
*B08B 3/10*     (2006.01)
*B08B 7/00*     (2006.01)
(Continued)

(52) U.S. Cl.
CPC ................ *B08B 3/10* (2013.01); *B08B 3/022* (2013.01); *B08B 7/0071* (2013.01);
(Continued)

(58) Field of Classification Search
CPC ......... B08B 3/022; B08B 3/10; B08B 7/0071; H01L 51/001; H01L 51/0011; H01L 51/56
See application file for complete search history.

(56) References Cited

U.S. PATENT DOCUMENTS

2006/0102194 A1* 5/2006 Kim .......................... B08B 3/08
134/1
2010/0242988 A1  9/2010 Woo

FOREIGN PATENT DOCUMENTS

CN  103406301   * 11/2013
CN  103408301 A  11/2013

* cited by examiner

*Primary Examiner* — Saeed T Chaudhry
(74) *Attorney, Agent, or Firm* — Andrew C. Cheng (57) ABSTRACT

The present invention relates to a cleaning method and a cleaning apparatus for a mask. The cleaning method includes: step 1, providing a to-be-cleaned mask which is made of metal and has an organic material film attached thereto; step 2, heating the to-be-cleaned mask with microwave to break up the organic material film attached to the mask; step 3, stopping heating with microwave, and spraying the heated mask with a solution to remove off the broken organic material film from the mask; step 4, cleaning residual organic material film on the mask with a solution; step 5, rinsing the cleaned mask to wash off residual solution on the mask; step 6, drying the rinsed mask with microwave. Accordingly, the cleaning period of mask is dramatically shortened, the cleaning productivity is increased and the probability of material residue is decreased.

7 Claims, 9 Drawing Sheets

(51) Int. Cl.
  *B08B 3/02* (2006.01)
  *H01L 51/00* (2006.01)
  *H01L 51/56* (2006.01)
(52) U.S. Cl.
  CPC ......... *H01L 51/001* (2013.01); *H01L 51/0011* (2013.01); *H01L 51/56* (2013.01)

CLEANING METHOD AND CLEANING APPARATUS FOR A MASK

TECHNICAL FIELD

The present invention relates to the field of manufacturing organic electroluminescent display devices, and particularly to a cleaning method and a cleaning apparatus for a mask.

DESCRIPTION OF RELATED ART

Flat display device have the advantages of slim body, electricity-saving and radiation free, etc. and thus have been widely used. The conventional flat display devices primarily include liquid crystal display devices and organic electroluminescent display devices.

Since organic electroluminescent devices have characteristics of self-emissive, without backlight, high contrast, thin, wide viewing angle, fast response speed, applicable for flexible panel, wide application temperature range, and simple structure and manufacturing process, and thus is considered to be the next generation of developing technology of flat panel display devices. According to molecular weights of used organic electroluminescent materials, the organic electroluminescent devices are classified into small molecular organic electroluminescent devices (also referred to as OLEDs) and polymer-based organic electroluminescent devices (also referred to as PLEDs). Since the differences of molecular weight, the manufacturing processes of organic electroluminescent devices have large differences. The OLEDs mainly are manufactured by thermal evaporation, while the PLEDs are manufactured by spinning or inkjet printing.

The OLED generally includes a substrate, an ITO transparent anode formed on the substrate, a hole injection layer (HIL) formed on the ITO transparent anode, a hole transportation layer (HTL) formed on the hole injection layer, an emitting layer (EML) formed on the hole transportation layer, an electron transportation layer (ETL) formed on the emitting layer, an electron injection layer (EIL) formed on the electron transportation layer, and a cathode formed on the electron injection layer. In order to the improvement of efficiency, the emitting layer generally uses the donor/acceptor doping system.

A current main method of manufacturing the OLED is thermal evaporation coating, and a mask generally is made of metal. The metal mask must be cleaned after a period of evaporation in order to avoid the change of accuracy resulting from the evaporation material attached thereto. A traditional cleaning method for a mask is wet-type immersion cleaning, but has the drawbacks of long cleaning time, requiring high purity solution and having material residue.

Figure 1:
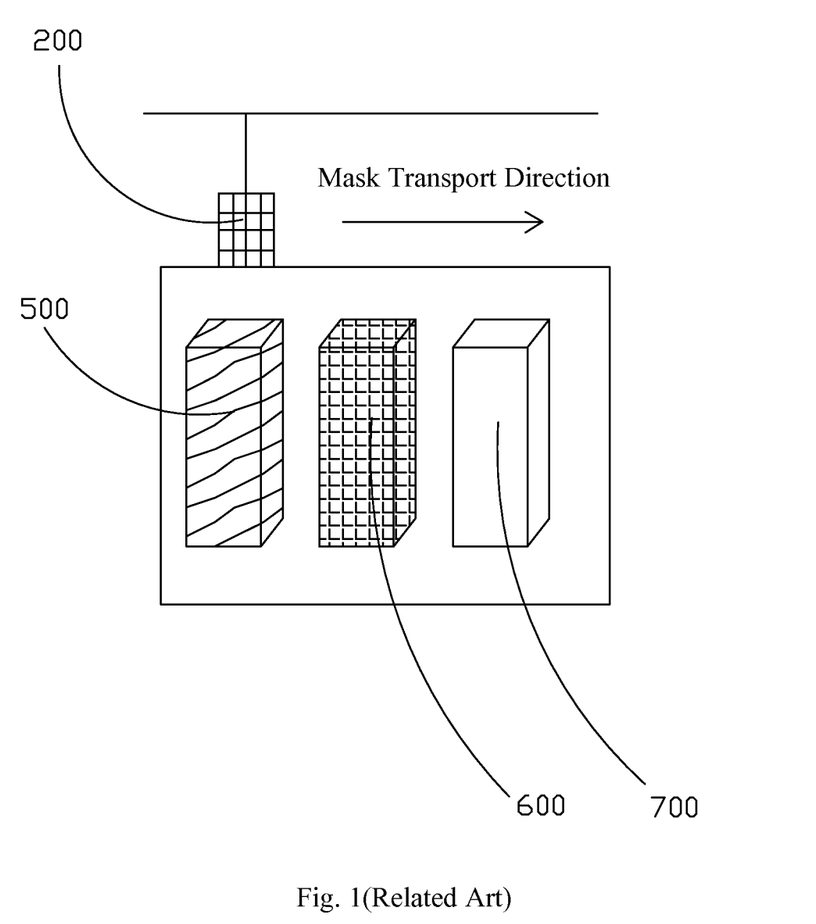
FIG. 1 is a schematic structural view of a conventional cleaning apparatus for a mask.

FIG. 1 is a schematic structural view of a conventional cleaning apparatus for a mask. The cleaning apparatus includes a solution wet-type cleaning tank 500, a solution wet-type washing tank 600 and a drying tank 700. The numerical reference 200 represents a to-be-cleaned OLED metal mask. The conventional cleaning method is that: the OLED metal mask 200 firstly is put into the solution wet-type cleaning tank 500 contained with a solution for cleaning to remove off an organic material attached to the surface of the OLED metal mask, the cleaned OLED metal mask then is put into the solution wet-type washing tank 600 contained with a detergent for rinsing to wash off residual solution on the surface of the cleaned OLED metal mask, and the rinsed OLED metal mask finally is put into the drying tank 700 for drying. However, the conventional cleaning method has the drawbacks of long cleaning time, requiring high purity solution and having material residue.

SUMMARY

An objective of the present invention is to provide a cleaning method for a mask, in order to overcome the drawbacks of long solution immersion cleaning time and inefficiency and thereby shortening the cleaning period, increasing the cleaning productivity and reducing the probability of material residue.

Another objective of the present invention is to provide a cleaning apparatus for a mask, which has the advantages of simple structure, easy operation and practical function and can effectively increase the cleaning efficiency of mask.

In order to achieve the above objectives, in one aspect, a cleaning method for a mask according to an exemplary embodiment of the present invention includes following steps:

step 1: providing a to-be-cleaned mask, the mask being made of metal and having an organic material film attached thereto;

step 2: heating the to-be-cleaned mask with microwave to break up the organic material film attached to the mask;

step 3: stopping heating with microwave, and spraying a solution onto the microwave-heated mask to remove off the broken organic material film from the mask;

step 4: cleaning residual organic material film on the mask with a solution;

step 5: rinsing the cleaned mask to wash off residual solution on the mask; and step 6: drying the rinsed mask with microwave.

In an exemplary embodiment, the mask is used for an OLED evaporation process.

In an exemplary embodiment, the step 2 and step 3 both are performed in a microwave dry-type cleaning tank. The microwave thy-type cleaning tank includes a tank body, a microwave generator disposed at the bottom of the tank body, and a solution sprayer disposed at the top of the tank body. The mask is heated with microwave by the microwave generator. The mask is sprayed with the solution by the solution sprayer.

In an exemplary embodiment, in the step 2 and step 3, the to-be-cleaned mask is obliquely arranged in the microwave dry-type cleaning tank, the organic material film faces upwards, and the solution sprayer is a low speed solution sprayer.

In an exemplary embodiment, the step 4 is performed in a solution wet-type cleaning tank, and the solution wet-type cleaning tank is contained with a solution into which the mask is immersed.

In an exemplary embodiment, the step 5 is performed in a solution wet-type washing tank, and the solution wet-type washing tank is contained with a detergent into which the mask is immersed.

In an exemplary embodiment, the step 6 is performed in the microwave dry-type cleaning tank.

In another aspect, a cleaning apparatus for a mask according to an exemplary embodiment of the present invention includes: a microwave dry-type cleaning tank, a solution wet-type cleaning tank and a solution wet-type washing tank. The microwave dry-type cleaning tank includes a tank body, a microwave generator disposed at the bottom of the tank body, and a low speed solution sprayer disposed at the top of the tank body.

In an exemplary embodiment, the microwave dry-type cleaning tank, the solution wet-type cleaning tank and the solution wet-type washing tank are adjacently arranged in that order.

In an exemplary embodiment, the solution wet-type cleaning tank is contained with a solution, the solution wet-type washing tank is contained with a detergent, the mask is made of metal and used for an OLED evaporation process.

In still another aspect, a cleaning apparatus for a mask according to an exemplary embodiment of the present invention includes: a microwave dry-type cleaning tank, a solution wet-type cleaning tank, and a solution wet-type washing tank. The microwave dry-type cleaning tank includes a tank body, a microwave generator disposed at the bottom of the tank body, and a low speed solution sprayer disposed at the top of the tank body. The microwave dry-type cleaning tank, the solution wet-type cleaning tank and the solution wet-type washing tank are adjacently arranged in that order. The solution wet-type cleaning tank is contained with a solution, the solution wet-type washing tank is contained with a detergent, the mask is made of metal and used for an OLED evaporation process.

Beneficial effects of the present invention may be that: the cleaning method and cleaning apparatus for a mask according to the present invention employ the microwave dry-type cleaning method and apparatus to pre-process the mask with microwave before the mask put into the solution wet-type cleaning tank, so that the organic material attached to the mask immediately before put into the solution wet-type cleaning tank is dramatically reduced, the cleaning effect and cleaning efficiency of the mask are increased, the cleaning period is shortened, the cleaning productivity is increased and thereby facilitating the whole productivity improvement of OLED display device.

BRIEF DESCRIPTION OF THE DRAWINGS

The above embodiments will become more readily apparent to those ordinarily skilled in the art after reviewing the following detailed description and accompanying drawings.

DETAILED DESCRIPTION OF EMBODIMENTS

The present invention will now be described more specifically with reference to the following embodiments. It is to be noted that the following descriptions of embodiments are presented herein for purpose of illustration and description only. It is not intended to be exhaustive or to be limited to the precise form disclosed.

Referring to FIGS. 2 through 9, a cleaning apparatus 10 for a mask according to an exemplary embodiment of the present invention is used for cleaning a to-be-cleaned mask 20. The cleaning apparatus 10 includes a microwave dry-type cleaning tank 40, a solution wet-type cleaning tank 50 and a solution wet-type washing tank 60. The microwave dry-type cleaning tank 40 includes a tank body 41, a microwave generator 45 disposed at the bottom of the tank body, and a low speed solution sprayer 43 disposed at the top of the tank body.

Figure 2:
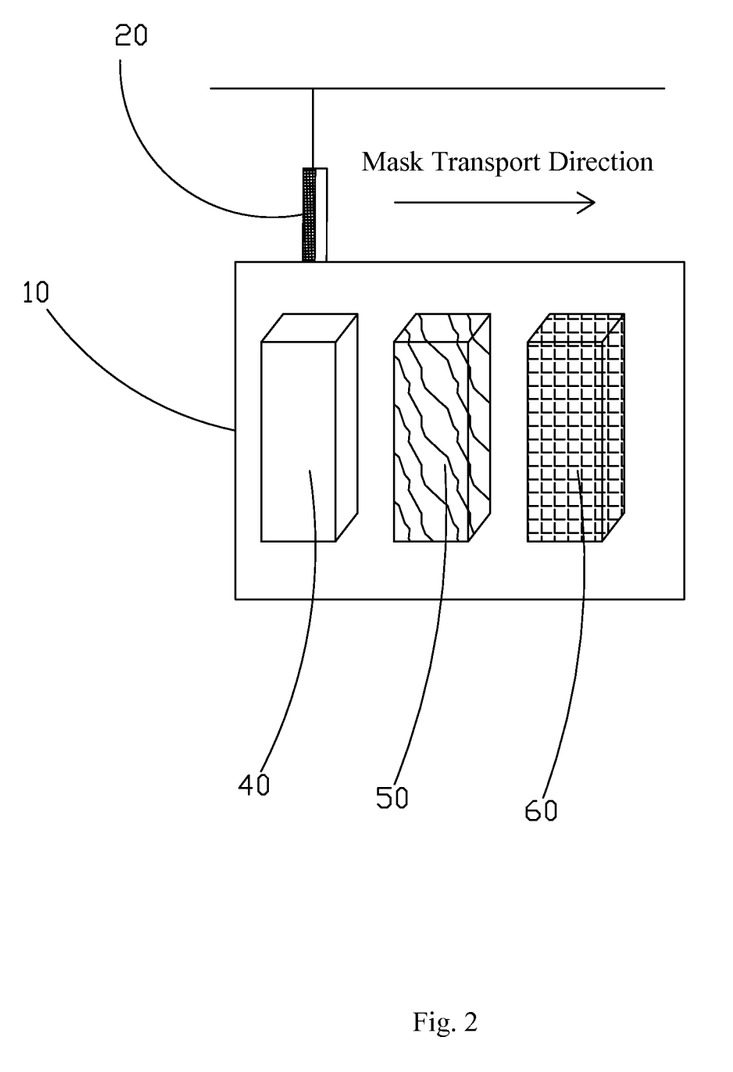
FIG. 2 is a schematic structural view of a cleaning apparatus for a mask according to an exemplary embodiment of the present invention.

The microwave dry-type cleaning tank 40, the solution wet-type cleaning tank 50 and the solution wet-type washing tank 60 are adjacently arranged in that order.

The low speed solution sprayer 43 in operation is to spray a solution 432 onto the mask 20.

The solution wet-type cleaning tank 50 is contained with a solution 432. The solution wet-type washing tank 60 is contained with a detergent 62. The mask 20 is made of metal and used for an OLED evaporation process.

Figure 3:
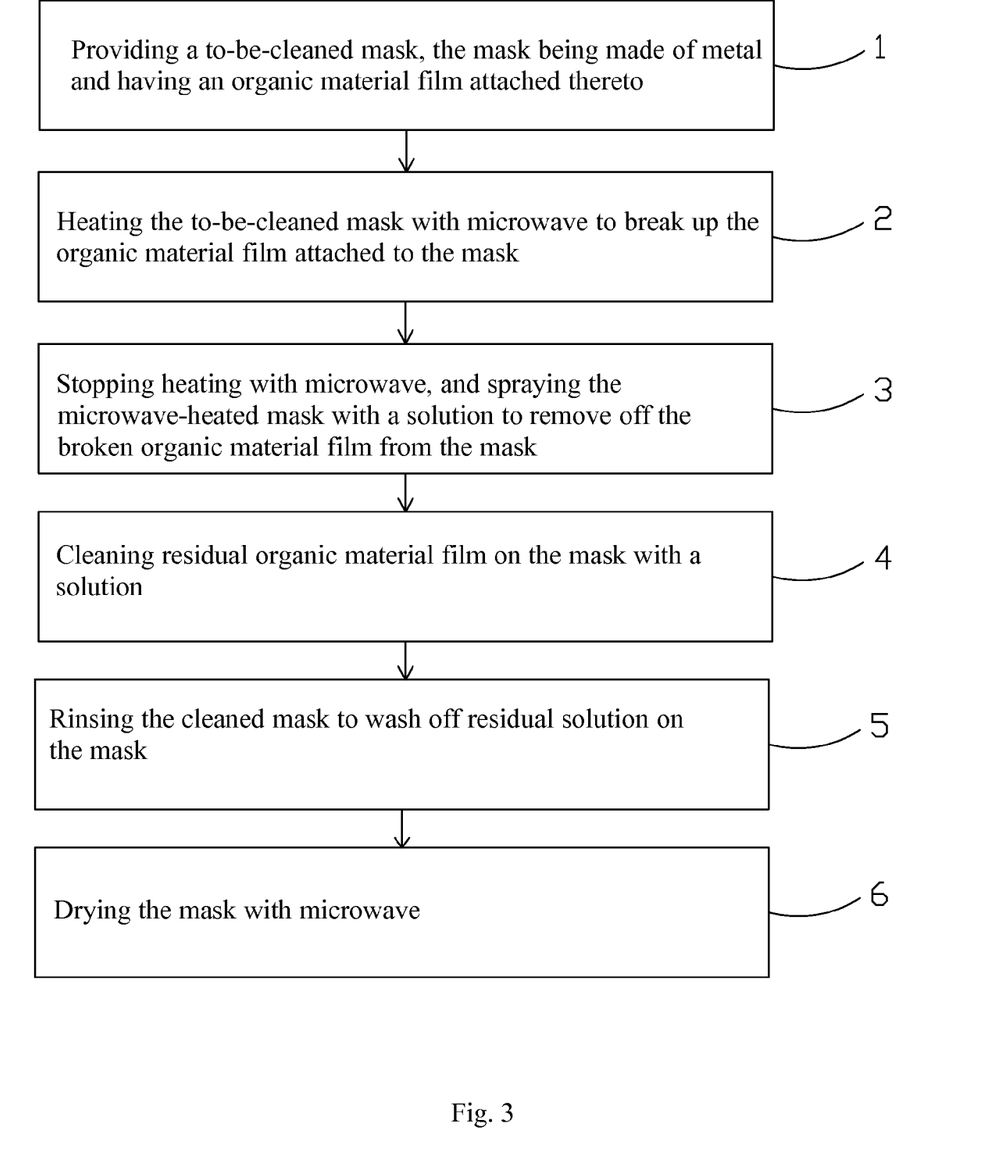
FIG. 3 is a schematic flowchart of a cleaning method for a mask according to an exemplary embodiment of the present invention.

A cleaning method for a mask according to an exemplary embodiment of the present invention includes the following step 1 to step 6.

Step 1: a to-be-cleaned mask 20 is provided. The mask is made of metal and has an organic material film 21 attached thereto.

The mask is used for an OLED evaporation process.

Step 2: the to-be-cleaned mask 20 is heated with microwave to thereby break up the organic material layer 21 attached to the mask 20.

Figure 4:
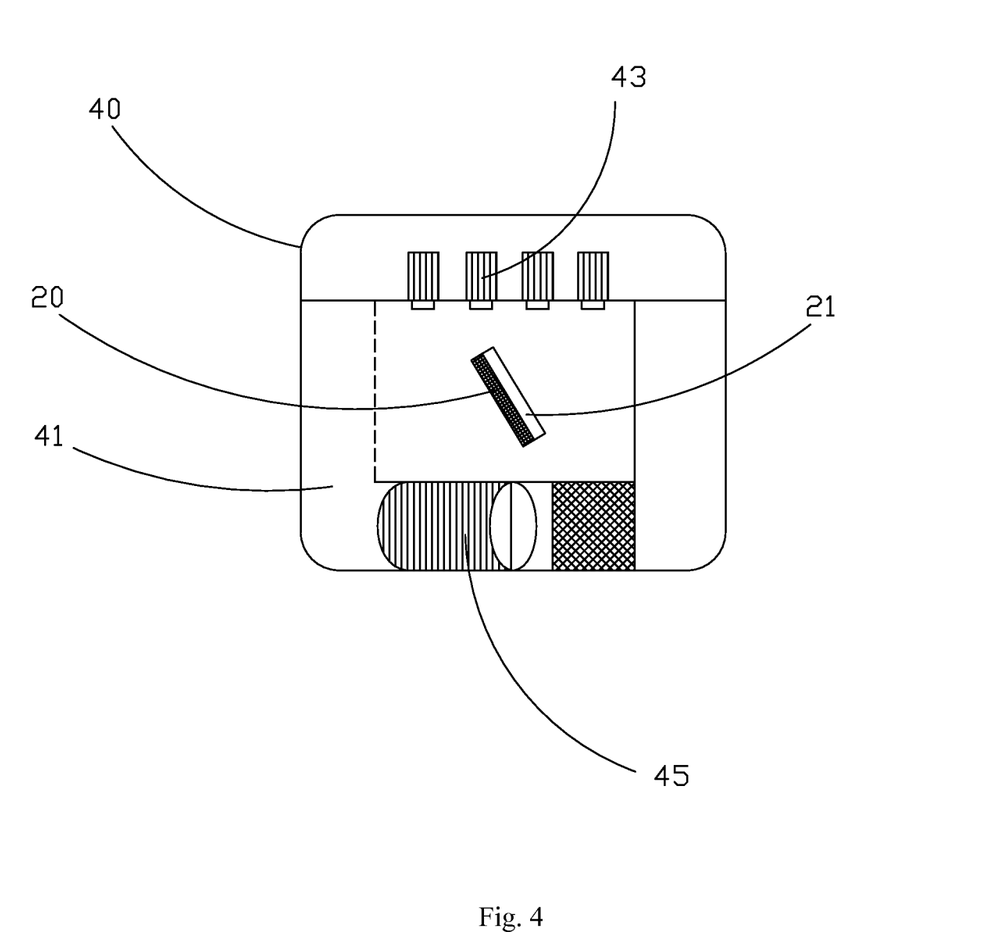
FIG. 4 is a schematic view of an operation in step 2 of the cleaning method according to the exemplary embodiment of the present invention.

As illustrated in FIG. 4, the step 2 is performed in the microwave dry-type cleaning tank 40. The microwave dry-type cleaning tank 40 includes a tank body 41, a microwave generator 45 disposed at the bottom of the tank body, and a solution sprayer 43 disposed at the top of the tank body. The mask 20 is heated with microwave by the microwave generator 45. The to-be-cleaned mask 20 is obliquely arranged in the microwave dry-type cleaning tank 40. The organic material film 21 faces upwards.

Figure 5:
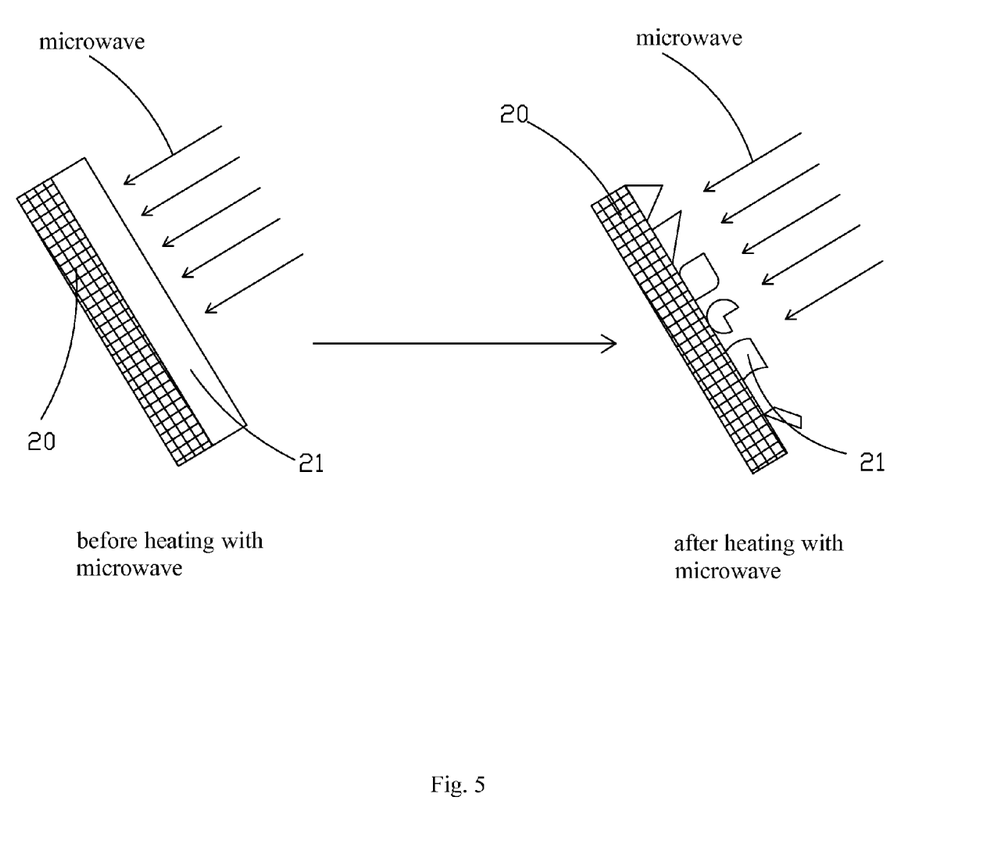
FIG. 5 is a schematic view of comparison of the mask before and after microwave processing in step 2 of the cleaning method according to the exemplary embodiment of the present invention.

As illustrated in FIG. 5, the organic material film 21 attached onto the mask 20 is effected by polarization rotation friction of microwave and then is broken from inside to outside into small pieces.

Step 3: heating with microwave is stopped, and the microwave-heated mask 20 is then sprayed with the solution 432 to wash off the broken organic material film 21 from the mask 20.

Figure 6:
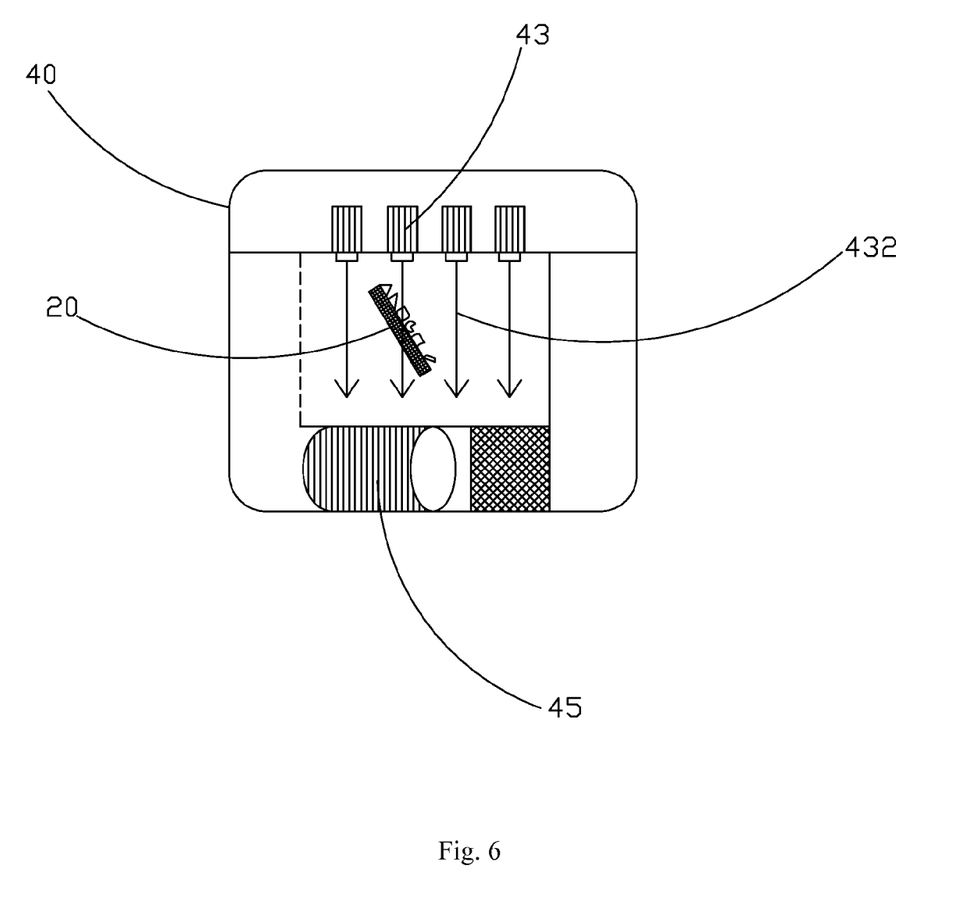
FIG. 6 is a schematic view of an operation in step 3 of the cleaning method according to the exemplary embodiment of the present invention.

As illustrated in FIG. 6, the step 3 is performed in the microwave dry-type cleaning tank 40. The to-be-cleaned mask 20 is obliquely arranged in the microwave dry-type cleaning tank 40. The organic material film 21 faces upwards. The mask 20 is sprayed with the solution 432 by the solution sprayer 43. The solution sprayer 43 is a low speed solution sprayer.

After a period of spraying, most of the organic material film 21 is removed off from the mask 20, and the residual is the organic material strongly attached to the mask 20.

Step 4: the residual organic material film 21 attached to the mask 20 is cleaned with the solution 432.

Figure 7:
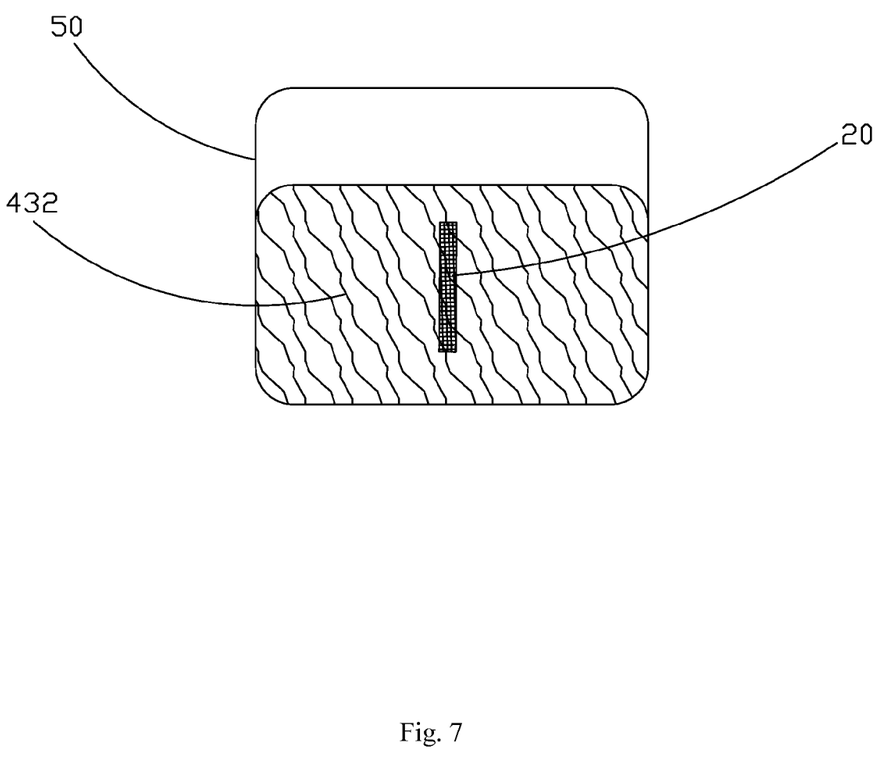
FIG. 7 is a schematic view of an operation in step 4 of the cleaning method according to the exemplary embodiment of the present invention.

As illustrated in FIG. 7, the step 4 is performed in the solution wet-type cleaning tank 50. The solution wet-type cleaning tank 50 is contained with the solution 432, and the mask 20 is immersed into the solution 432 for cleaning.

By the immersion of solution 432, the residual organic material film 21 is cleaned up by the solution 432.

Step 5: the cleaned mask 20 is rinsed to wash off the residual solution on the mask 20.

Figure 8:
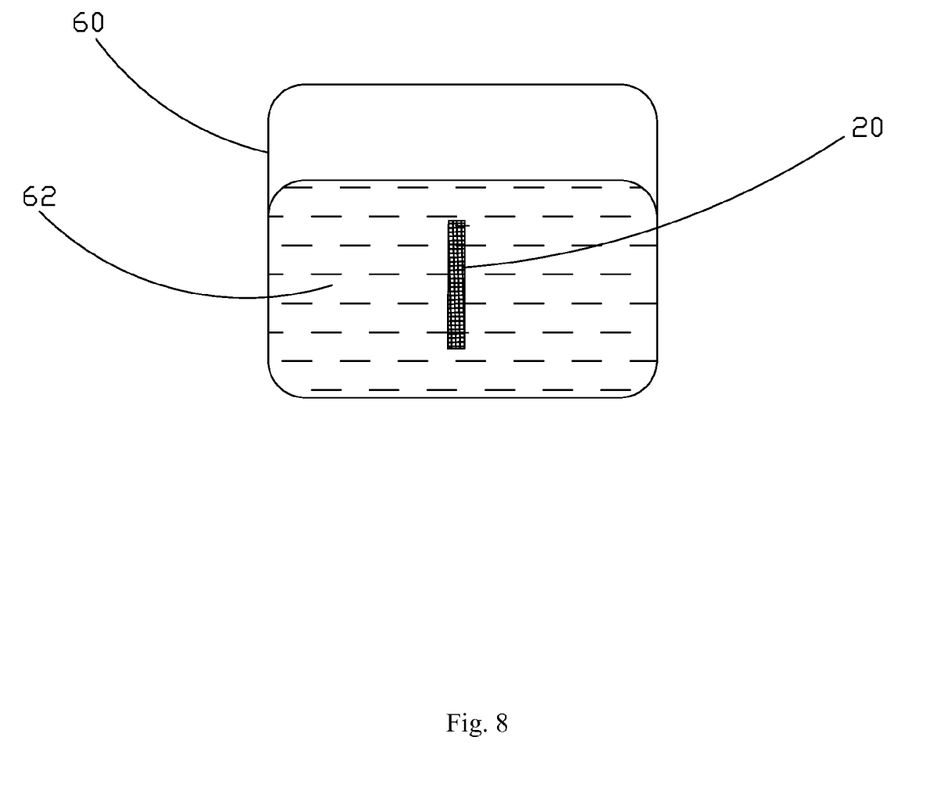
FIG. 8 is a schematic view of an operation in step 5 of the cleaning method according to the exemplary embodiment of the present invention.

As illustrated in FIG. 8, the step 5 is performed in the solution wet-type washing tank 60. The solution wet-type washing tank 60 is contained with a detergent 62, and the mask 20 is immersed into the detergent 62 for rinsing.

Step 6: the mask 20 then is dried with microwave.

Figure 9:
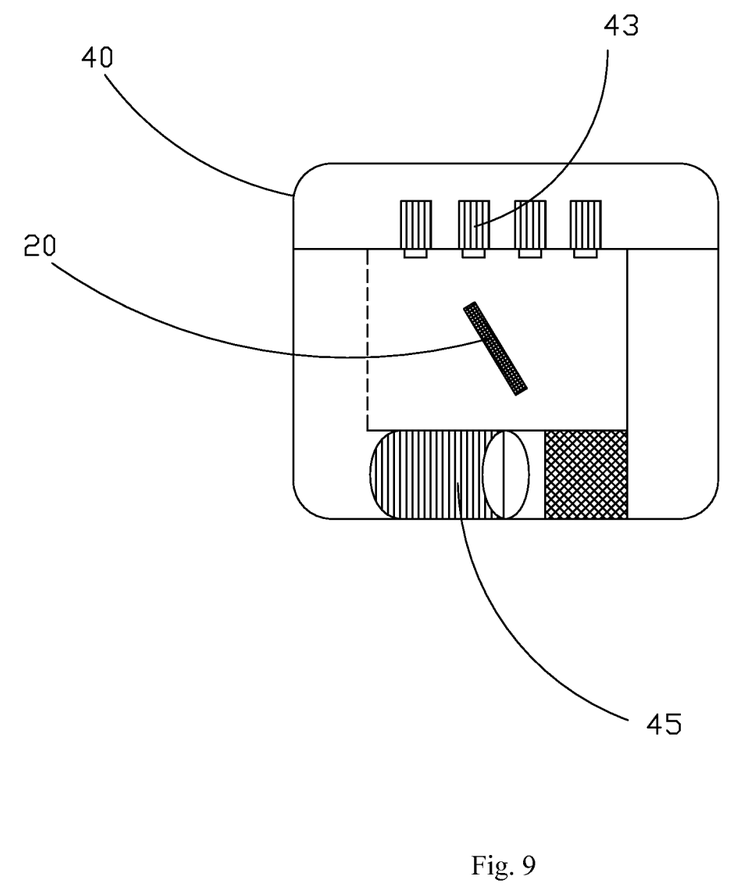
FIG. 9 is a schematic view of an operation in step 6 of the cleaning method according to the exemplary embodiment of the present invention.

As illustrated in FIG. 9, the step 6 is performed in the microwave dry-type cleaning tank 40. The mask 20 is heated with microwave by the microwave generator 45. The mask 20 is obliquely arranged in the microwave dry-type cleaning tank 40.

In summary, the cleaning method and cleaning apparatus for a mask according to the present invention employ the microwave dry-type cleaning method and apparatus to pre-process the mask with microwave before the mask put into the solution wet-type cleaning tank, so that the organic material attached to the mask immediately before put into the solution wet-type cleaning tank is dramatically reduced, the cleaning effect and cleaning efficiency of the mask are increased, the cleaning period is shortened, the cleaning productivity is increased and thereby facilitating the whole productivity improvement of OLED display device.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:
1. A cleaning method for a mask, comprising:
   step 1: providing a to-be-cleaned mask, wherein the mask is made of metal and has an organic material film attached thereto;
   step 2: heating the to-be-cleaned mask with microwave to break up the organic material film attached to the mask;
   step 3: stopping the heating with microwave, and spraying a solution onto the microwave-heated mask to remove off the broken organic material film from the mask;
   step 4: cleaning residual organic material film on the mask with a solution;
   step 5: rinsing the cleaned mask to wash off residual solution on the mask; and
   step 6: drying the rinsed mask with microwave;
   wherein the step 2 and step 3 both are performed in a microwave dry cleaning tank, the step 4 is performed in a solution wet cleaning tank, and the step 5 is performed in a solution wet washing tank; and
   the microwave dry cleaning tank, the solution wet cleaning tank and the solution wet washing tank are adjacently arranged in order.

2. The cleaning method as claimed in claim 1, wherein the mask is used for an organic light emitting diode evaporation process.

3. The cleaning method as claimed in claim 1, wherein the microwave dry cleaning tank comprises a tank body, a microwave generator disposed at the bottom of the tank body and a solution sprayer disposed at the top of the tank body; the mask is heated with microwave by the microwave generator; and the mask is sprayed with the solution by the solution sprayer.

4. The cleaning method as claimed in claim 3, wherein in the step 2 and step 3, the to-be-cleaned mask is obliquely disposed in the microwave dry cleaning tank, the organic material film faces upwards, and the solution sprayer is a low speed solution sprayer.

5. The cleaning method as claimed in claim 1, wherein the solution wet cleaning tank is contained with a solution into which the mask is immersed.

6. The cleaning method as claimed in claim 1, wherein the solution wet washing tank is contained with a detergent into which the mask is immersed.

7. The cleaning method as claimed in claim 3, wherein the step 6 is performed in the microwave dry cleaning tank.

* * * * *